United States Patent
Wang et al.

(10) Patent No.: US 6,362,491 B1
(45) Date of Patent: Mar. 26, 2002

(54) METHOD OF OVERLAY MEASUREMENT IN BOTH X AND Y DIRECTIONS FOR PHOTO STITCH PROCESS

(75) Inventors: Jen-Pan Wang, Kwan-Miao; Lin-June Wu, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/409,876

(22) Filed: Oct. 1, 1999

(51) Int. Cl.[7] .............................. G01B 11/00; G03F 9/00
(52) U.S. Cl. ..................... 250/548; 250/559.3; 356/401
(58) Field of Search ............................. 250/548, 559.3; 356/399, 400, 401; 355/77; 430/22

(56) References Cited

U.S. PATENT DOCUMENTS

| | | | |
|---|---|---|---|
| 4,149,085 A | 4/1979 | Davis et al. | 250/492 A |
| 4,883,359 A | * 11/1989 | Ina et al. | 356/401 |
| 5,300,786 A | 4/1994 | Brunners et al. | 250/548 |
| 5,498,500 A | 3/1996 | Bae | 430/22 |
| 5,701,013 A | 12/1997 | Hsia et al. | 250/491.1 |
| 5,952,134 A | * 9/1999 | Hwang | 430/22 |

* cited by examiner

*Primary Examiner*—John R. Lee
(74) *Attorney, Agent, or Firm*—George O. Saile; Stephen B. Ackerman; Larry J. Prescott

(57) ABSTRACT

A method of determining overlay accuracy, using visual inspection, of a first circuit pattern relative to a second circuit pattern. The first circuit pattern and the second circuit pattern are too large to be contained in a single reticle and are formed separately on an integrated circuit wafer and photo stitched together. A first overlay pattern is located adjacent to the first circuit pattern on a mask. A second overlay pattern is located adjacent to the second circuit pattern on a mask, preferably, but not necessarily, the same mask. The first overlay pattern and the second overlay pattern are located so that their images in the layer of developed photoresist will be adjacent to each other after the photoresist is exposed with the first and second circuit patterns and developed. Visual observation of the images of the first and second overlay patterns is then used to determine the overlay accuracy of the first circuit pattern relative to the second circuit pattern.

20 Claims, 5 Drawing Sheets

METHOD OF OVERLAY MEASUREMENT IN BOTH X AND Y DIRECTIONS FOR PHOTO STITCH PROCESS

BACKGROUND OF THE INVENTION (1) Field of the Invention

This invention relates to a pattern and method of using the pattern for the measurement of overlay accuracy of two patterns interconnected on a wafer using a photo stitch process.

(2) Description of the Preferred Embodiments

Chip sizes are often larger than the available reticle size used to expose patterns on the wafer. This requires interconnecting patterns on two different reticles using a photo stitch process. In a photo stitch process overlay accuracy is of great importance. Methods of measuring overlay accuracy and patterns used in the measurement of overlay accuracy are also important.

U.S. Pat. No. 5,701,013 to Hsia et al. describes a wafer metrology pattern integrating both overlay and critical dimension features.

U.S. Pat. No. 4,149,085 to Davis et al. describes a method and apparatus for performing automatic overlay measurements on semiconductor wafers.

U.S. Pat. No. 5,498,500 to Bae describes an overlay measurement mark and method of measuring an overlay error between multi patterns of a semiconductor device.

U.S. Pat. No. 5,300,786 to Brunner et al. describes an optical phase shift test pattern, monitoring system, and process.

SUMMARY OF THE INVENTION

As chip images become larger the circuit images become too large for a single mask reticle. In these cases it is necessary to divide the chip image into two separate reticles and expose them separately on an integrated circuit wafer. The images of each of the two separate reticles are then stitched together to make a single circuit image. Alignment of the images of the two separate reticles is of critical importance in forming a single circuit image from the two separate images. It is very desirable that the alignment of two images can be made easily using visual inspection of the images.

It is a principle objective of this invention to provide a pattern and method for determining the overlay accuracy of two images to be stitched together in a single chip.

This objective is achieved using a first overlay pattern adjacent to a first chip image on a mask and a second overlay pattern adjacent to a second chip image on a mask, preferably the same mask. When a layer of photoresist is exposed with the first and second chip images it is also exposed with the first and second overlay patterns. After the photoresist is developed, the first and second overlay patterns are visually inspected and the overlay accuracy in both the X and Y directions can be determined.

The first overlay pattern comprises a rectangular first center mark, a first number of rectangular first side marks having a width equal to a first distance to the left of the first center mark, and the first number of rectangular second side marks having a width equal to the first distance to the right of the first center mark. The second overlay pattern comprises a rectangular second center mark, the first number of rectangular third side marks to the left of the second center mark, and the first number of rectangular fourth side marks to the right of the center mark. The third side mark nearest the second center mark has a width equal to the first distance plus a second distance and the width of each successive third side mark increases by the second distance. The fourth side mark nearest the second center mark has a width equal to the first distance plus the second distance and the width of each successive fourth side mark increases by the second distance.

There is a rectangular third center mark located within the second center mark, wherein the top of the third center mark coincides with the top of the second center mark. There is a third distance between the bottom of the third center mark and the bottom of the second center mark.

The alignment accuracy in the X direction is determined by visually comparing the position of the image of the first side marks relative to the image of the third side marks and the position of the image of the second side marks relative to the image of the fourth side marks. The alignment accuracy in the Y direction is determined by visually comparing the distance between top of the image of the first center mark to the top of the image of the third side mark relative the image of the third distance.

Perfect alignment in the X direction is indicated when the right side of the image of each of the first side marks is co-linear with the right side of the image of one of the third side marks and the left side of the image of each of the second side marks is co-linear with the image of the left side of one of the fourth side marks. Perfect alignment in the Y direction is indicated when the distance between the image of the top of the first center mark and the image of the top of the third center mark is equal to the third distance.

DESCRIPTION OF THE PREFERRED EMBODIMENTS

Figure 1:
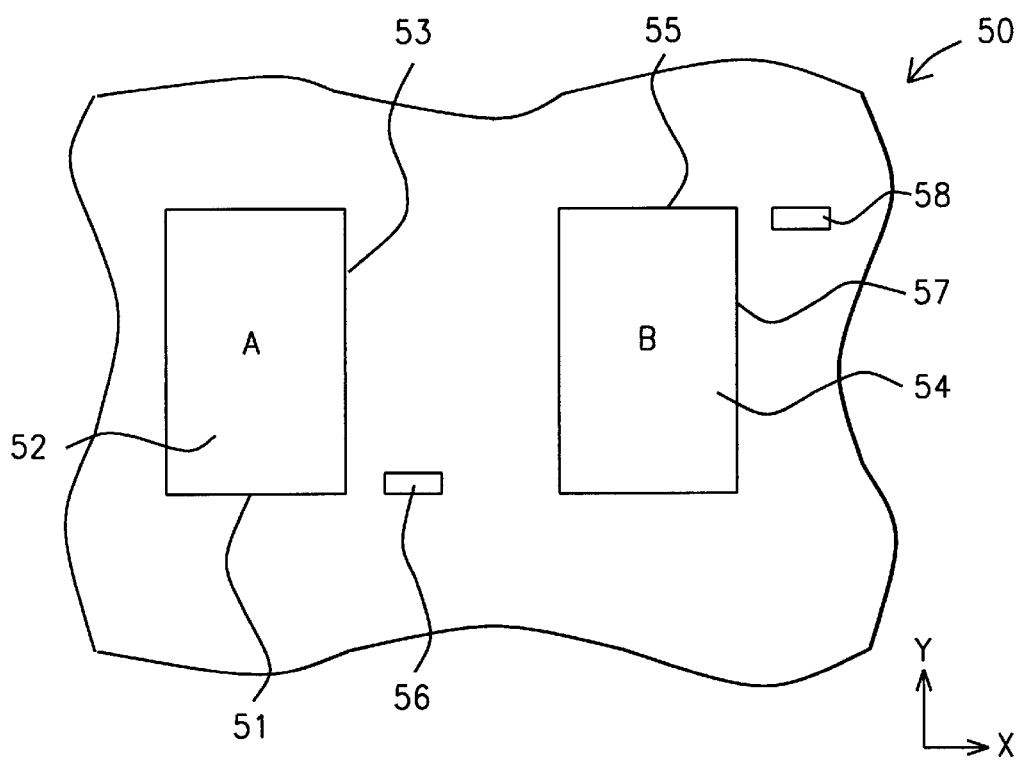
FIG. 1 shows a top view of a mask showing two circuit patterns and two overlay patterns.

Refer now to FIGS. 1–9 for a description of the preferred embodiment of the overlay pattern and method of overlay measurement of this invention. FIG. 1 shows a top view of a mask 50 having a first mask segment with first circuit pattern 52 and a second mask segment with a second circuit pattern 54. These circuit patterns will be used to form a single chip which is too large to fit on a single mask segment. In order to monitor the overlay accuracy when images of the two circuit patterns are formed on a wafer a first overlay pattern 56 is located in the die sawing line adjacent to the right edge 53 of the first circuit pattern 52 and in line with the bottom edge 51 of the first circuit pattern 52. A second overlay pattern 58 is located in the die sawing line adjacent to the right edge 57 of the second circuit pattern 54 and in line with the top edge 55 of the second circuit pattern 54. Orthogonal X and Y directions are indicated in FIG. 1.

The first circuit pattern 52, the second circuit pattern 54, the first overlay pattern 56, and the second overlay pattern 58 are shown in the same mask in FIG. 1, although the first circuit pattern 52 and the first overlay pattern 56 will be exposed in one exposure step and the second circuit pattern 54 and the second overlay pattern 58 will be exposed in another exposure step. Those skilled in the art will readily recognize that the first circuit pattern 52 and the first overlay pattern 56 could be in one mask and the second circuit pattern 54 and the second overlay pattern 58 in another mask. Those skilled in the art will also recognize that the first overlay pattern 56 and the second overlay pattern could be located in the die sawing line adjacent to the left edge of the first circuit pattern 52 and the die sawing line adjacent to the left edge of the second circuit pattern 54. Both the first overlay pattern and the second overlay pattern must both be located in the die sawing line adjacent to the right edge of the first and second circuit patterns, as in this example, or must both be located in the die sawing line adjacent to the left edge of the first and second circuit patterns so they will line up with each other when a layer of photoresist is exposed with both circuit patterns.

Figure 2:
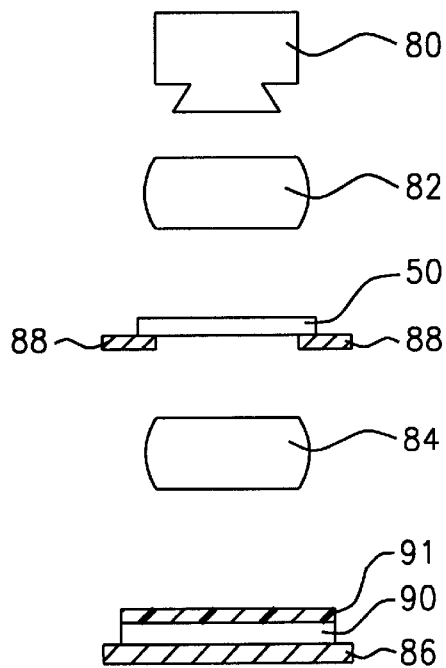
FIG. 2 shows a schematic view of an exposure and alignment system.

FIG. 2 shows a schematic diagram of an alignment and exposure system used to transfer the patterns from the mask 50 to a layer of photoresist 91 on an integrated circuit wafer 90. The alignment and exposure system has a light source 80, a condensing lens 82, a mask holder 88 holding a mask 50, an objective lens 84, and a wafer holder 86 holding the wafer 90. The mask holder 88 and the wafer holder 86 can be moved relative to each other so that the mask 50 can be aligned to the layer of photoresist 91 on the wafer 90. After the mask and wafer are aligned the mask images are focussed on the layer of photoresist and the photoresist is exposed.

Figure 3:
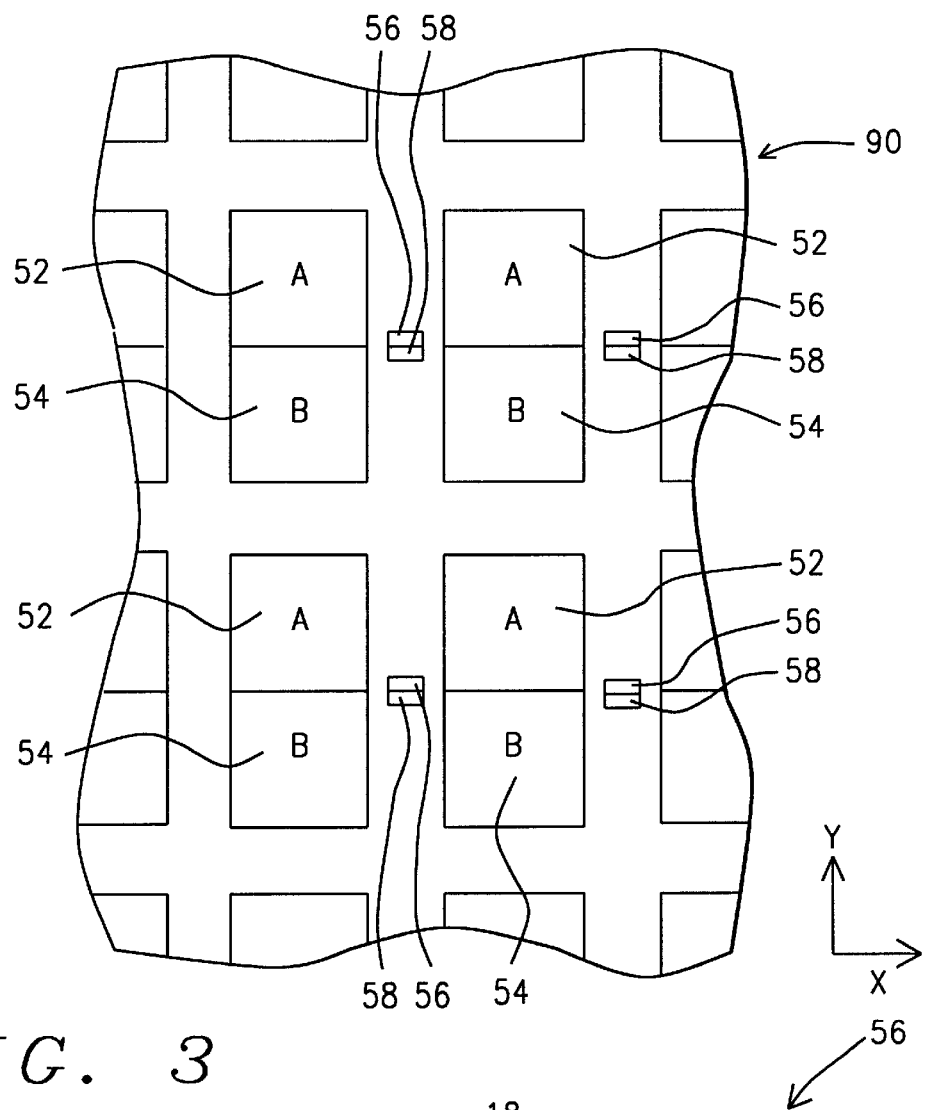
FIG. 3 shows a top view of a part of a wafer after the images of the two circuit patterns and two overlay patterns have been formed in a layer of photoresist.

FIG. 3 shows a segment of the wafer 90 showing how the first circuit pattern 52, the second circuit pattern 54, the first overlay pattern 56, and the second overlay pattern 58 fit together. The first overlay pattern 56 is located in the scribeline region of the first circuit pattern 52 and the second overlay pattern 58 is located in the scribeline region of the second circuit pattern 54. The first overlay pattern 56 and second overlay pattern 58 are located so as not to interfere with the photo stitching of the first circuit pattern 52 and second circuit pattern 54. Orthogonal X and Y directions are indicated in FIG. 3. After the layer of photoresist has been exposed with the first circuit pattern 52, the second circuit pattern 54, the first overlay pattern 56, and the second overlay pattern 58 the photoresist is developed and the overlay patterns are visually inspected to determine the overlay accuracy.

Figure 4:
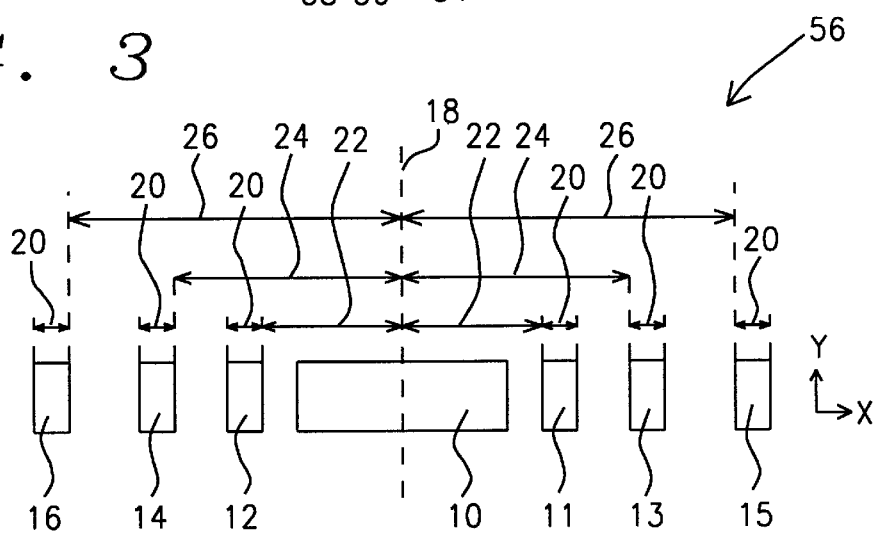
FIG. 4 shows a top view of the first overlay pattern.

FIG. 4 shows a detailed view of the first overlay pattern. The first overlay pattern has a rectangular first center mark 10; a first 12, a third 14, and a fifth 16 rectangular side marks, each having a width equal to a first distance, to the left of the first center mark 10; and a second 11, a fourth 13, and a sixth 15 rectangular side mark also having a width equal to the first distance to the right of said first center mark. The first overlay pattern is symmetrical about a first centerline 18 which is parallel to the Y direction. In this example the image of the first distance in the developed photoresist is between about 0.8 and 1.2 micrometers. The distance between the right side of the first side mark 12 and the first center line 18 and between the left side of the second side mark 11 is a second distance 22. The distance between the right side of the third side mark 14 and the first center line 18 and between the left side of the fourth side mark 13 is a third distance 24. The distance between the right side of the fifth side mark 16 and the first center line 18 and between the left side of the sixth side mark 15 is a fourth distance 26. In this example the image of the second distance 22 in the developed layer of photoresist is between about 3.0 and 3.6 micrometers, the image of the third distance 24 in the developed layer of photoresist is between about 5.0 and 6.0 micrometers, and the image of the fourth distance 26 in the developed layer of photoresist is between about 7.0 and 9.0 micrometers. Orthogonal X and Y directions are indicated in FIG. 4.

Figure 5:
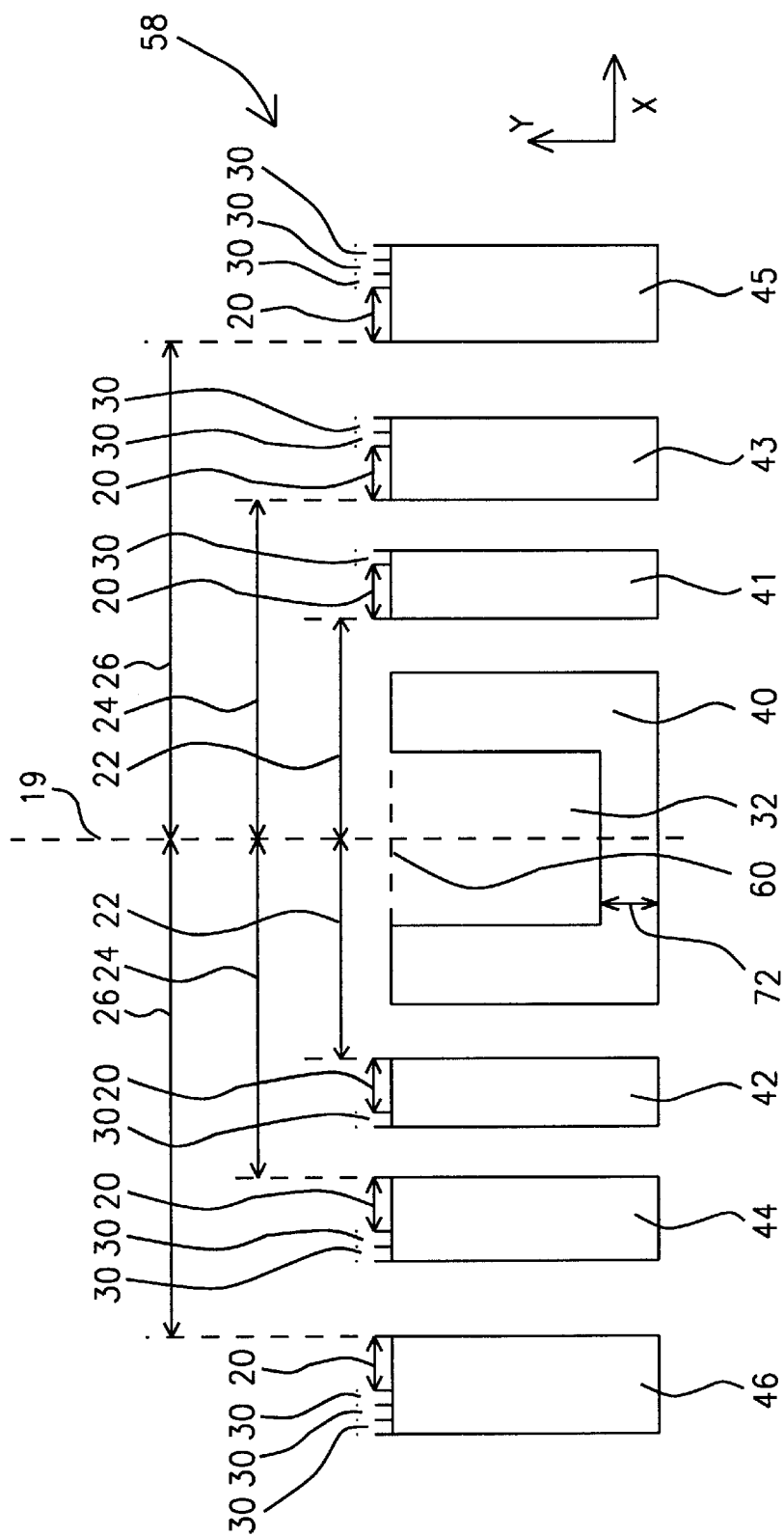
FIG. 5 shows a top view of the second overlay pattern.

FIG. 5 shows a detailed view of the second overlay pattern. FIG. 5 shows a second center mark 40 and a rectangular third center mark 32 located within the second center mark. The top of the second center mark 40 and the top of the third center mark 32, indicated by a dashed line 60, lie on the same line. The second overlay pattern is symmetrical about a second centerline 19. The distance between the bottom of the second center mark 40 and the bottom of the third center mark 32 is a fifth distance 72. In this example the image of the fifth distance 72 in a developed layer of photoresist is between about 0.8 and 1.2 micrometers.

FIG. 5 shows a seventh 42, a ninth 44, and an eleventh 46 side mark to the left of the second center mark 48 and an eighth 41, a tenth 43, and a twelfth 45 side mark to the right of the second center mark 40. The width of the seventh side mark 42 and the eighth side mark 41 is the first distance 20 plus a sixth distance 30. The width of the ninth side mark 44 and the tenth side mark 43 is the first distance 20 plus two times the sixth distance 30. The width of the eleventh side mark 46 and the twelfth side mark 45 is the first distance 20 plus three times the sixth distance 30. In this example the image of the sixth distance in a layer of photoresist is between about 0.08 and 0.12 micrometers.

The distance between the right side of the seventh side mark 42 and the second center line 19 and between the left side of the eighth side mark 41 and the second center line 19 is the second distance 22. The distance between the right side of the ninth side mark 44 and the second center line 19 and the distance between the left side of the tenth side mark 43 and the second center line 19 is the third distance. The distance between the right side of the eleventh side mark 46 and the second center line 19 and between the left side of the twelfth side mark 45 and the second center line 19 is the fourth distance.

In this example the image of the second distance 22 in the developed layer of photoresist is between about 3.0 and 3.6 micrometers, the image of the third distance 24 in the developed layer of photoresist is between about 5.0 and 6.0 micrometers, and the image of the fourth distance 26 in the developed layer of photoresist is between about 7.0 and 9.0 micrometers. Orthogonal X and Y directions are indicated in FIG. 5.

Figure 6:
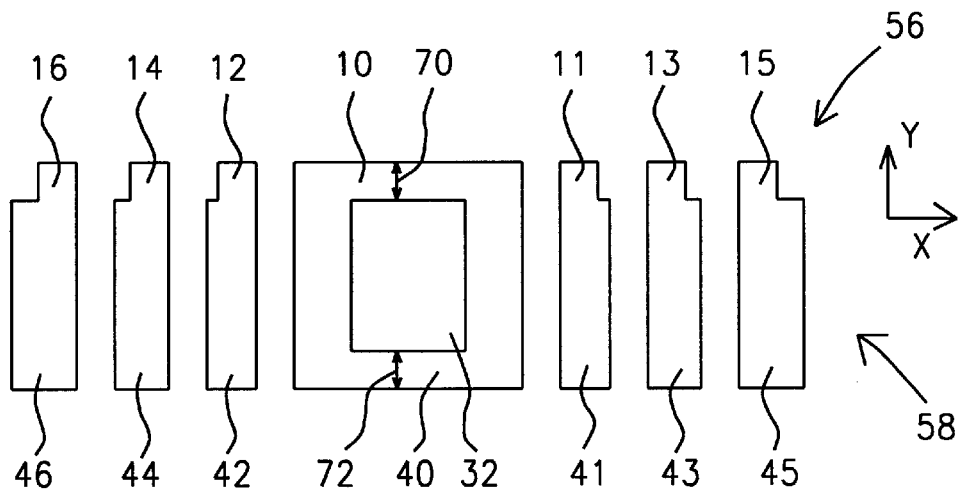
FIG. 6 shows a top view of the image of the first overlay pattern and the second overlay pattern in a layer of photoresist showing perfect alignment in both the X and Y directions between the first and second circuit patterns.

FIG. 6 shows the image in the layer of photoresist of the first 56 and second 58 overlay patterns for the case of perfect of the first circuit pattern relative to the second circuit pattern. As shown in FIG. 6, the center marks and the side marks in the first and second overlay patterns are located such that perfect alignment is indicated when, in the image in the layer of photoresist, the right sides of the first 12, third 14, and fifth 16 side marks are co-linear with the right sides of the seventh 42, ninth 44, and eleventh 46 side marks respectively; the left sides of the second 11, fourth 13, and sixth 15 side marks are co-linear with the left sides of the eighth 41, tenth 43, and twelfth 45 side marks respectively; and the distance 70 between the top of the first center mark 10 and the top of the third center mark 32 is the same as the fifth distance 72, which is the distance between the bottom of the second center mark 40 and the bottom of the third center mark 32. This condition can readily be detected by visual observation.

Figure 7:
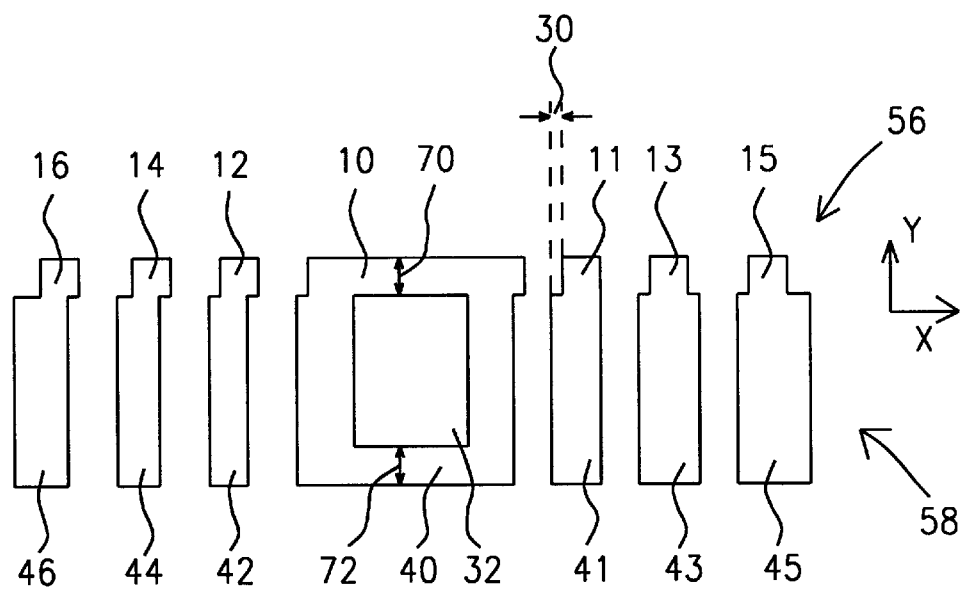
FIG. 7 shows a top view of the image of the first overlay pattern and the second overlay pattern in a layer of photoresist showing misalignment between the first and second circuit patterns in the X direction and perfect alignment between the first and second circuit patterns in the Y direction.

FIG. 7 shows the image in the layer of photoresist of the first 56 and second 58 overlay patterns for the case where the first circuit pattern is mis-aligned relative to the second circuit pattern in the X direction, but is perfectly aligned with the second circuit pattern in the Y direction. As shown in FIG. 7, in this case, in the image in the layer of photoresist, the right side of the second side mark 11 is co-linear with the right side of the eighth 41 side mark indicating a misalignment in the X direction equal to the sixth distance 30. As shown in FIG. 7, in this case, in the image in the layer of photoresist, the distance 70 between the top of the first center mark 10 and the top of the third center mark 32 is the same as the fifth distance 72, indicating perfect alignment in the Y direction. This condition can readily be detected by visual observation.

Figure 8:
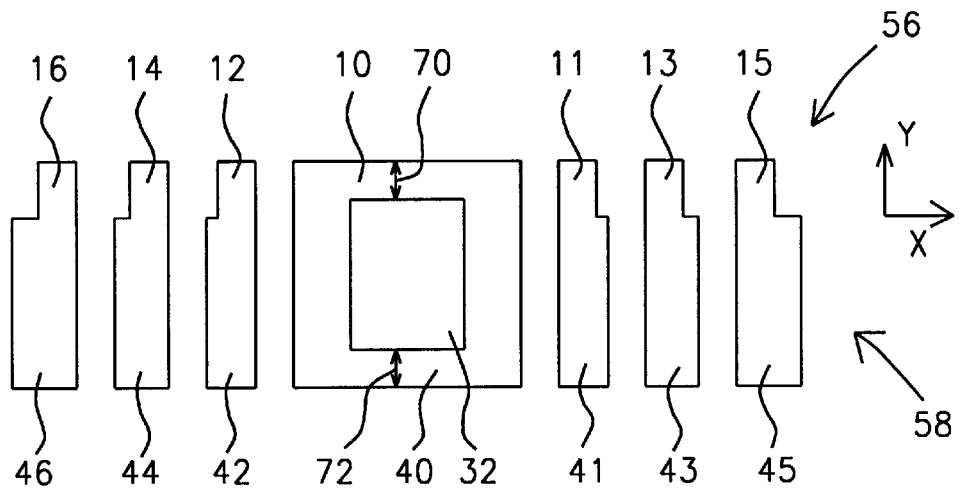
FIG. 8 shows a top view of the image of the first overlay pattern and the second overlay pattern in a layer of photoresist showing perfect alignment between the first and second circuit patterns in the X direction and misalignment between the first and second circuit patterns in the Y direction.

FIG. 8 shows the image in the layer of photoresist of the first 56 and 58 second overlay patterns for the case of perfect alignment of the first circuit pattern relative to the second circuit pattern in the X direction and misalignment of the first circuit pattern relative to the second circuit pattern in the Y direction. As shown in FIG. 8, the center marks and the side marks in the first and second overlay patterns are located such that, in the image in the layer of photoresist, the right sides of the first 12, third 14, and fifth 16 side marks are co-linear with the right sides of the seventh 42, ninth 44, and eleventh 46 side marks respectively and the left sides of the second 11, fourth 13, and sixth 15 side marks are co-linear with the left sides of the eighth 41, tenth 43, and twelfth 45 side marks respectively indicating perfect alignment in the X direction. As shown in FIG. 8, in the image in the layer of photoresist, the distance 70 between the top of the first center mark 10 and the top of the third center mark 32 is greater than the fifth distance 72, indicating mis-alignment in the Y direction. This condition can readily be detected by visual observation.

Figure 9:
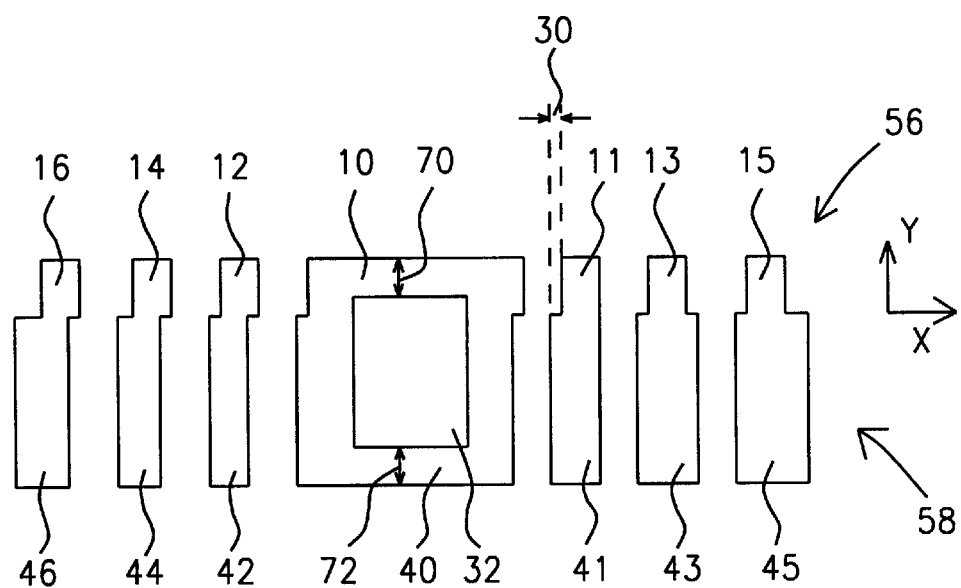
FIG. 9 shows a top view of the image of the first overlay pattern and the second overlay pattern in a layer of photoresist showing misalignment in both the X and Y directions between the first and second circuit patterns.

FIG. 9 shows the image in the layer of photoresist of the first 56 and second 58 overlay patterns for the case of mis-alignment of the first circuit pattern relative to the second circuit pattern in both the X and Y directions. As shown in FIG. 9, in the image in the layer of photoresist, the right side of the second side mark 11 is co-linear with the right side of the eighth 41 side mark indicating a misalignment in the X direction equal to the sixth distance 30. Also as shown in FIG. 9, in the image in the layer of photoresist, the distance 70 between the top of the first center mark 10 and the top of the third center mark 32 is greater than the fifth distance 72, indicating mis-alignment in the Y direction. This condition can readily be detected by visual observation.

The orthogonal X and Y directions are shown in FIGS. 6–9. The examples described in this embodiment have three side marks to the right of the center marks and three side marks to the left of the center marks in both the first and second overlay patterns. Those skilled in the art will readily recognize that more or less than three side marks to the right of the center marks and more or less than three side marks to the left of the center marks can be used for the method of this invention.

While the invention has been particularly shown and described with reference to the preferred embodiments thereof, it will be understood by those skilled in the art that various changes in form and details may be made without departing from the spirit and scope of the invention.

What is claimed is:

1. A method of measuring overlay accuracy, comprising:
providing an integrated circuit wafer having a layer of photoresist formed thereon;
providing a first mask having a first circuit pattern and a first overlay pattern adjacent to said first circuit pattern;
providing a second mask having a second circuit pattern and a second overlay pattern adjacent to said second circuit pattern;
providing an exposure and alignment system;
aligning said first mask and exposing said layer of photoresist with images of said first circuit pattern and said first overlay pattern using said exposure and alignment system and a first exposure step;
aligning said second mask to said integrated circuit wafer and exposing said layer of photoresist with images of said second circuit pattern and said second overlay pattern using said exposure and alignment system and a second exposure step;
developing said layer of photoresist thereby forming images of said first circuit pattern, said first overlay pattern, said second circuit pattern, and said second overlay pattern in said layer of photoresist; and
determining the alignment accuracy of said second circuit pattern relative to said first circuit pattern by visually comparing the position of the image of said first overlay pattern to the image of said second overlay pattern.

2. The method of claim 1 wherein said first mask and said second mask are on a single mask substrate.

3. The method of claim 1 wherein said first mask is on a first mask substrate and said second mask is on a second mask substrate.

4. The method of claim 1 wherein said first circuit pattern has a bottom edge, a right edge, and a die sawing line adjacent to said right edge of said first circuit pattern; said second circuit pattern has a top edge, a right edge, and a die sawing line adjacent to said right edge of said second circuit pattern; said first overlay pattern is located in said die sawing line adjacent to said right edge of said first circuit pattern and on a line with said bottom edge of said first circuit pattern; and said second overlay pattern is located adjacent to said right edge of said second circuit pattern and on a line with said top edge of said second circuit pattern.

5. The method of claim 1 wherein said first circuit pattern has a bottom edge, a left edge, and a die sawing line adjacent to said left edge of said first circuit pattern; said second circuit pattern has a top edge, a left edge, and a die sawing line adjacent to said left edge of said second circuit pattern; said first overlay pattern is located in said die sawing line adjacent to said left edge of said first circuit pattern and on a line with said bottom edge of said first circuit pattern; and said second overlay pattern is located adjacent to said left edge of said second circuit pattern and on a line with said top edge of said second circuit pattern.

6. The method of claim 1 wherein said first overlay pattern comprises a rectangular first center mark, a first number of rectangular first side marks having a width equal to a first distance to the left of said first center mark, and said first number of rectangular second side marks having a width equal to said first distance to the right of said first center mark; and said second overlay pattern comprises a rectangular second center mark, said first number of rectangular third side marks to the left of said second center mark, said first number of rectangular fourth side marks to the right of said center mark, the third side mark nearest said second center mark has a width equal to said first distance plus a second distance, the width of each successive third side mark increases by said second distance, the fourth side mark nearest said second center mark has a width equal to said first distance plus said second distance, and the width of each successive fourth side mark increases by said second distance.

7. A method of measuring overlay accuracy, comprising:
providing an integrated circuit wafer having a layer of photoresist formed thereon;
providing a mask having a first circuit pattern and a second circuit pattern, wherein said first circuit pattern and said second circuit pattern have a top edge, a bottom edge, a right edge, a left edge, a die sawing line adjacent to said right edge, and a die sawing line adjacent to said left edge;
providing a first overlay pattern in said die sawing line adjacent to said right edge of said first circuit pattern and in line with said top edge of said first circuit pattern, wherein said first overlay pattern comprises a rectangular first center mark, a first number of rectangular first side marks having a width equal to a first distance to the left of said first center mark, and said first number of rectangular second side marks having a width equal to said first distance to the right of said first center mark;
providing a second overlay pattern in said die sawing line adjacent to said right edge of said second mask pattern and in line with said top edge of said second mask pattern, wherein said second overlay pattern comprises a rectangular second center mark, said first number of rectangular third side marks to the left of said second center mark, said first number of rectangular fourth side marks to the right of said center mark, the third side mark nearest said second center mark has a width equal to said first distance plus a second distance, the width of each successive third side mark increases by said second distance, the fourth side mark nearest said second center mark has a width equal to said first distance plus said second distance, and the width of each successive fourth side mark increases by said second distance;
providing a rectangular third center mark located within said second center mark, wherein the top of said third center mark coincides with the top of said second center mark and there is a third distance between the bottom of said third center mark and the bottom of said second center mark;
providing an exposure and alignment system;
aligning said first circuit pattern and said first overlay pattern to said integrated circuit wafer and exposing said layer of photoresist with images of said first circuit pattern and said first overlay pattern using said exposure and alignment system and a first exposure step;
aligning said second circuit pattern and said second overlay pattern to said integrated circuit wafer and exposing said layer of photoresist with images of said second circuit pattern and said second overlay pattern using said exposure and alignment system and a second exposure step;
developing said layer of photoresist thereby forming images of said first circuit pattern, said first overlay pattern, said second circuit pattern, and said second overlay pattern in said layer of photoresist; and
determining the alignment accuracy of said second circuit pattern relative to said first circuit pattern by visually comparing the position of the image of said first side marks relative to the image of said third side marks, the position of the image of said second side marks relative to the image of said fourth side marks, and the distance between top of the image of said first center mark to the top of the image of the third side mark relative to the image of said third distance.

8. The method of claim 7 wherein said image of said first distance in said developed layer of photoresist is between about 0.8 and 1.2 micrometers.

9. The method of claim 7 wherein said image of said second distance in said developed layer of photoresist is between about 0.08 and 0.12 micrometers.

10. The method of claim 7 wherein said image of said third distance in said developed layer of photoresist is between about 0.8 and 1.2 micrometers.

11. The method of claim 7 wherein perfect alignment of said first circuit pattern and said second circuit pattern to said integrated circuit wafer is indicated when the right side of the image of each of said first side marks is co-linear with the right side of the image of one of said third side marks, the left side of the image of each of said second side marks is co-linear with the image of the left side of one of said fourth side marks, and the distance between the image of the top of said first center mark and the image of the top of said third center mark is equal to said third distance.

12. A method of measuring overlay accuracy, comprising:
providing an integrated circuit wafer having a layer of photoresist formed thereon;
providing a mask having a first circuit pattern and a second circuit pattern, wherein said first circuit pattern and said second circuit pattern have a top edge, a bottom edge, a left edge, a right edge, a die sawing line adjacent to said right edge, and a die sawing line adjacent to said left edge;
providing a first overlay pattern in said die sawing line adjacent to said right edge of said first circuit pattern and in line with said bottom edge of said first circuit pattern, wherein said first overlay pattern has a top side, a bottom side, a left side, and a right side;
determining a first centerline perpendicular to said top side and said bottom side of said first overlay pattern and midway between said left side and said right side of said first overlay pattern;
providing a second overlay pattern in said die sawing line adjacent to said right edge of said second circuit pattern and in line with said top edge of said second circuit pattern, wherein said second overlay pattern has a top side, a bottom side, a left side, and a right side;
determining a second centerline perpendicular to said top side and said bottom side of said second overlay pattern and midway between said left side and said right side of said second overlay pattern;

providing an alignment and exposure system;

aligning said first circuit pattern and said first overlay pattern to said integrated circuit wafer;

exposing said layer of photoresist with images of said first circuit pattern and said first overlay pattern using said exposure system and a first exposure step;

aligning said second circuit pattern and said second overlay pattern to said integrated circuit wafer;

exposing said layer of photoresist with images of said second circuit pattern and said second overlay pattern using said exposure system and a second exposure step;

developing said layer of photoresist thereby forming images of said first circuit pattern, said first overlay pattern, said second circuit pattern, and said second overlay pattern in said layer of photoresist; and determining the alignment accuracy of said second circuit pattern relative to said first circuit pattern using visual inspection of said images of said first overlay pattern and said second overlay pattern.

13. The method of claim 12 wherein said first overlay pattern comprises:

a rectangular first center mark in said first overlay pattern having a right side, a left side, a top side, and a bottom side, wherein said first center line is perpendicular to said top side and said bottom side of said first center mark and midway between said right side and said left side of said first center mark;

a first, a second, a third, a fourth, a fifth, and a sixth side mark in said first overlay pattern, each of said first, second, third, fourth, fifth, and sixth side marks having a left side, a right side, and a width equal to a first distance, wherein the distance between said right side of said first side mark and said first center line is a second distance, the distance between said right side of said third side mark and said first center line is a third distance, the distance between said right side of said fifth side mark and said first center line is a fourth distance, the distance between said left side of said second side mark and said first center line is said second distance, the distance between said right side of said fourth side mark and said first center line is said third distance, and the distance between said left side of said fifth side mark and said first center line is said fourth distance;

a rectangular second center mark in said second overlay pattern having a right side, a left side, a top side, and a bottom side, wherein said second center line is perpendicular to said top side and said bottom side of said second center mark and midway between said right side and said left side of said second center mark;

a rectangular third center mark, located within said second center mark, having a right side, a left side, a top side, and a bottom side, wherein said top side of said third center mark is co linear with said top side of said second center mark, said second center line is midway between said right side and said left side of said third center mark, and the distance between said bottom side of said third center mark and the bottom side of said second center mark is a fifth distance;

a seventh and an eighth side mark in said second overlay pattern, said seventh and eighth side marks having a left side, a right side, and a width equal to said first distance plus a sixth distance, wherein the distance between said right side of said seventh side mark and said second center line is said second distance, and the distance between said left side of said eighth side mark and said second center line is said second distance;

a ninth and a tenth side mark in said second overlay pattern, said ninth and tenth side marks having a left side, a right side, and a width equal to said first distance plus two times said sixth distance, wherein the distance between said right side of said ninth side mark and said second center line is said third distance, and the distance between said left side of said tenth side mark and said second center line is said third distance; and an eleventh and a twelfth side mark in said second overlay pattern, said eleventh and twelfth side marks having a left side, a right side, and a width equal to said first distance plus three times said sixth distance, wherein the distance between said right side of said eleventh side mark and said second center line is said fourth distance, and the distance between said left side of said twelfth side mark and said second center line is said fourth distance.

14. The method of claim 13 wherein said image of said first distance in said developed layer of photoresist is between about 0.8 and 1.2 micrometers.

15. The method of claim 13 wherein said image of said sixth distance in said developed layer of photoresist is between about 0.08 and 0.12 micrometers.

16. The method of claim 13 wherein said image of said fifth distance in said developed layer of photoresist is between about 0.8 and 1.2 micrometers.

17. The method of claim 13 wherein said image of said second distance in said developed layer of photoresist is between about 3.0 and 3.6 micrometers.

18. The method of claim 13 wherein said image of said third distance in said developed layer of photoresist is between about 5.0 and 6.0 micrometers.

19. The method of claim 13 wherein said image of said fourth distance in said developed layer of photoresist is between about 7.0 and 9.0 micrometers.

20. The method of claim 13 wherein perfect alignment of said first circuit pattern and said second circuit pattern to said integrated circuit wafer is indicated when said right side of said image of said first side mark is co-linear with said right side of said image of said seventh side mark, said right side of said image of said third side mark is co-linear with said right side of said image of said ninth side mark, said right side of said image of said fifth side mark is co-linear with said right side of said image of said eleventh side mark, said left side of said image of said second side mark is co-linear with said left side of said image of said eighth side mark, said left side of said image of said fourth side mark is co-linear with said left side of said image of said tenth side mark, said left side of said image of said sixth side mark is co-linear with said left side of said image of said twelfth side mark, and the distance between said top side of said first center mark and said top side of said third center mark is equal to said sixth distance.

* * * * *